(12) United States Patent
Wang et al.

(10) Patent No.: US 9,392,716 B2
(45) Date of Patent: Jul. 12, 2016

(54) DRIVER ASSEMBLY AND METHOD FOR MANUFACTURING THE SAME

(71) Applicant: OSRAM GmbH, Munich (DE)

(72) Inventors: MingTao Wang, Guangdong (CN); Guoan He, Wuxi Jiangsu (CN); LiBo Wu, Shaoxing Zhejiang (CN)

(73) Assignee: OSRAM GMBH, Munich (DE)

( * ) Notice: Subject to any disclaimer, the term of this patent is extended or adjusted under 35 U.S.C. 154(b) by 122 days.

(21) Appl. No.: 14/355,258

(22) PCT Filed: Oct. 10, 2012

(86) PCT No.: PCT/EP2012/070021
§ 371 (c)(1),
(2) Date: Apr. 30, 2014

(87) PCT Pub. No.: WO2013/064343
PCT Pub. Date: May 10, 2013

(65) Prior Publication Data
US 2014/0247563 A1    Sep. 4, 2014

(30) Foreign Application Priority Data

Nov. 3, 2011    (CN) .......................... 2011 1 0344449

(51) Int. Cl.
*H05K 7/20*    (2006.01)
*H05K 7/02*    (2006.01)
(Continued)

(52) U.S. Cl.
CPC ................ *H05K 7/02* (2013.01); *F21K 9/1355* (2013.01); *F21K 9/1375* (2013.01);
(Continued)

(58) Field of Classification Search
CPC . G06F 1/181–1/182; H05K 7/20218–7/20381; H05K 7/20409–7/20418; H05K 7/20009–7/202; H01L 23/367–7/3677; H01L 23/473; H01L 23/46–23/467
USPC ........................ 361/676–678, 679.46–679.54, 361/688–723; 165/80.1–80.5, 104.33, 185; 174/15.1–15.3, 16.1–16.3, 547, 548; 257/712–722, E23.088; 24/453, 24/458–459; 454/184; 312/236
See application file for complete search history.

(56) References Cited

U.S. PATENT DOCUMENTS 4,563,725 A * 1/1986 Kirby .................. H01L 23/4006
174/16.3
6,876,550 B2 * 4/2005 Sri-Jayantha ......... H01L 23/467
165/121

(Continued)

FOREIGN PATENT DOCUMENTS

CN    1630912 A    6/2005
CN    101599765 A    12/2009

(Continued)

OTHER PUBLICATIONS

Office action received for Chinese Patent Application No. 201110275241.3, mailed on Jun. 25, 2014, 8 pages of office action and 15 pages of English Translation.

(Continued)

*Primary Examiner* — Anthony Haughton
*Assistant Examiner* — Razmeen Gafur
(74) *Attorney, Agent, or Firm* — Viering, Jentschura & Partner mbB

(57) ABSTRACT

A driver assembly includes a driver housing and a driver, the driver including at least one first portion and a second portion, the first portion having a lower heat resistance than the second portion, wherein the driver housing includes at least one first cavity for at least partially accommodating the first portion and a second cavity for accommodating the second portion, and a potting material is potted into the first cavity to envelop the first portion.

11 Claims, 4 Drawing Sheets

(51) Int. Cl.
*F21K 99/00* (2016.01)
*H05K 13/00* (2006.01)
*F21V 19/00* (2006.01)
*F21Y 101/02* (2006.01)

(52) U.S. Cl.
CPC ......... *H05K 7/2039* (2013.01); *H05K 7/20463* (2013.01); *H05K 13/00* (2013.01); *F21V 19/003* (2013.01); *F21Y 2101/02* (2013.01); *Y10T 29/49124* (2015.01)

(56) References Cited

U.S. PATENT DOCUMENTS

| | | | | |
|---|---|---|---|---|
| 7,274,302 | B2 * | 9/2007 | Stevenson | G08G 1/095 340/815.45 |
| 7,932,535 | B2 * | 4/2011 | Mahalingam | F21V 29/02 257/713 |
| 8,230,690 | B1 * | 7/2012 | Salessi | F21V 3/00 165/185 |
| 8,269,248 | B2 * | 9/2012 | Thompson | F21K 9/00 257/675 |
| 8,444,299 | B2 * | 5/2013 | Chou | F21K 9/135 165/80.3 |
| 8,482,924 | B2 * | 7/2013 | Redpath | H01S 5/02469 361/675 |
| D691,568 | S * | 10/2013 | Holland | D13/179 |
| 8,860,310 | B2 * | 10/2014 | Huang | F21V 13/12 313/46 |
| D729,750 | S * | 5/2015 | Chen | D13/179 |
| 9,109,789 | B2 * | 8/2015 | Uhler | F21V 29/74 |
| 2003/0151942 | A1 | 8/2003 | Bardouillet et al. | |
| 2005/0122229 | A1 * | 6/2005 | Stevenson | G08G 1/095 340/815.45 |
| 2009/0002946 | A1 * | 1/2009 | Horng | F21V 29/80 361/697 |
| 2009/0008792 | A1 * | 1/2009 | Ko | H01L 21/561 257/774 |
| 2010/0181889 | A1 * | 7/2010 | Falicoff | F21K 9/00 313/46 |
| 2010/0242519 | A1 * | 9/2010 | Breidenassel | F21V 29/004 62/264 |
| 2010/0265663 | A1 * | 10/2010 | Yamashita | H01L 23/552 361/715 |
| 2011/0037367 | A1 * | 2/2011 | Wang | F21K 9/135 313/46 |
| 2011/0204780 | A1 * | 8/2011 | Shum | H05K 1/189 315/35 |
| 2011/0204820 | A1 * | 8/2011 | Tikkanen | H05B 33/0815 315/294 |
| 2011/0211314 | A1 * | 9/2011 | Hong-Chi | H01R 12/716 361/718 |
| 2011/0309751 | A1 * | 12/2011 | Ter-Hovhannisyan | F21V 29/004 315/113 |
| 2012/0007742 | A1 * | 1/2012 | Gooch | H01J 3/04 340/584 |
| 2012/0120659 | A1 * | 5/2012 | Lopez | F21V 19/045 362/249.02 |
| 2012/0176796 | A1 * | 7/2012 | Bertram | F21V 29/004 362/249.02 |
| 2012/0223640 | A1 * | 9/2012 | Koplow | F04D 17/16 315/50 |
| 2012/0307501 | A1 * | 12/2012 | Tankala | F21K 9/90 362/294 |
| 2013/0033166 | A1 * | 2/2013 | Kitamura | F21K 9/135 313/46 |
| 2013/0044500 | A1 * | 2/2013 | Reingruber | F21K 9/1355 362/382 |
| 2013/0077318 | A1 * | 3/2013 | Echigo | F21V 23/002 362/294 |
| 2013/0286666 | A1 * | 10/2013 | Bakk | F04F 7/00 362/363 |
| 2014/0049964 | A1 * | 2/2014 | McClure | F21V 29/2212 362/249.06 |
| 2014/0268730 | A1 * | 9/2014 | Lui | F21V 23/008 362/227 |

FOREIGN PATENT DOCUMENTS

| | | |
|---|---|---|
| DE | 2919058 A1 | 11/1980 |
| EP | 2163808 A1 | 3/2010 |
| GB | 1207265 A | 9/1970 |
| JP | 2007317573 A | 12/2007 |
| WO | 2011132465 A1 | 10/2011 |
| WO | 2011138257 A1 | 11/2011 |
| WO | 2011152115 A1 | 12/2011 |

OTHER PUBLICATIONS

Yao Yuan et al. "Design of the fully differential high speed low voltage latched comparator", Electronic Measurement Technology, vol. 32, No. 7, pp. 14-15 with its English abstract.
English abstract of JP 2007317573 A dated Dec. 6, 2007.
International Search Report issued in the corresponding PCT application No. PCT/EP2012/070021, dated Jan. 23, 2013.

* cited by examiner

DRIVER ASSEMBLY AND METHOD FOR MANUFACTURING THE SAME

RELATED APPLICATIONS

The present application is a national stage entry according to 35 U.S.C. §371 of PCT application No.: PCT/EP2012/070021 filed on Oct. 10, 2012, which claims priority from Chinese application No.: 201110344449.6 filed on Nov. 3, 2011, and is incorporated herein by reference in its entirety.

TECHNICAL FIELD

Various embodiments relate to a driver assembly and a method for manufacturing such driver assembly.

BACKGROUND

At present, LED illuminating devices are widely used in daily life, and retrofit lamps taking LED, especially high-power LED, as a light source also have a great prospect. Luminaries taking LED as a light source are also widely used, wherein it is a general configuration to put a driver inside, while in an illuminating device configured in such a manner, lots of heat generated by the driver in operation will increase the temperature of electronic assemblies on the driver, which will result in problems such as degraded performance, reduction of the service lifetime and even safety problem.

In the related art, a potting material can be used, for instance, to be potted into inside of a whole driver housing, to allow the heat of the driver to be quickly transferred from the driver to the driver housing. Generally, temperatures of most electronic assemblies on the driver do not exceed the heat resistance standard, and only a small number of electronic assemblies that have a poor heat resistance property, that is, temperatures thereof exceed the heat resistance standard thereof, need to be subjected to thermal dissipation treatment for assuring normal operation of the illuminating device and thereby prolonging the service lifetime thereof. In this situation, if the driver is wholly potted with a traditional method, unnecessary waste will be incurred, and thereby the manufacturing cost will be increased. Another possibility is to use a thermally conductive plastic to manufacture the driver housing, while the cost of this method is still too high, and the thermal dissipation effect that can be achieved is quite limited. The electronic devices that need to be subjected to thermal dissipation treatment also can be selectively coated with a thermal dissipation layer or selectively potted. Though this method has the advantage of a low cost, it is hard to control an operation process of selective coating or potting and final consistence as the thermal dissipation treatment is locally needed; moreover, as the electronic devices having a poor thermal resistance cannot directly contact the driver housing, the thermal properties of the retrofit lamp inside the driver are also limited to some degree.

SUMMARY

Therefore, various embodiments provide a novel driver assembly. The driver assembly of the present disclosure is easily manufactured, has a low cost, and realizes favorable thermal dissipation of electronic modules inside.

A driver assembly is provided according to the present disclosure, including a driver housing and a driver, wherein the driver includes at least a first portion and a second portion, the first portion having a lower heat resistance than the second portion, wherein the driver housing includes at least a first cavity for at least partially accommodating the first portion and a second cavity for accommodating the second portion, and a potting material is potted into the first cavity to envelop the first portion.

The concept of the present disclosure lies in locally enveloping a portion of the driver that has a lower heat resistance than the other portions in the driver housing accommodating the driver, that is, the portion that has a low heat resistance is subjected to a thermal dissipation treatment merely via a potting material potted into the first cavity corresponding to the portion that has a low heat resistance. As a result, the portion such as specific electronic module that has a low heat resistance is thermally connected with the driver housing via a small amount of potting material, and the driver, especially the portion that has a low heat resistance therein is subjected to a thermal dissipation treatment.

In various embodiments, the first portion is a first electronic module, and the second portion includes a PCB board for mounting the first electronic module and a second electronic module mounted on the PCB board. Part of region of the driver has a higher heat resistance than the first portion, or relatively is not sensitive to temperature, therefore, thermal dissipation requirements of the second electronic module can be satisfied by thermal dissipation properties of the driver housing per se.

In various embodiments, the driver housing includes a bottom for supporting the PCB board, the first cavity is defined by inner closed ribs formed in one piece with the bottom, and the second cavity is a space in the driver housing with exception of the first cavity. That is to say, apart from defining the first cavity in the driver housing, remaining space of the driver housing is defined as the second cavity.

In various embodiments, the first cavity has a geometrical shape matched with the first electronic module. Accordingly, the first electronic module can be enveloped with as little potting material as possible to save costs.

In various embodiments, the first cavity merely accommodates the first electronic module. In this case, the first electronic module such as that having a big height can be directly inserted into the first cavity and enveloped by the potting material. Such first electronic module having a big height is inductor, for example.

In various embodiments, the first portion further includes a heat conductor connected to an end surface of the first electronic module facing the first cavity, and the heat conductor and the first electronic module as a whole are at least partially jointly accommodated in the first cavity. In this case, the first electronic module such as that having a small height should be inserted into the first cavity having the potting material with the help of the heat conductor, and the potting material at least completely envelopes the heat conductor, and ideally, also envelopes at least part of the first electronic module. Such first electronic module having a small height is a chip, for example.

In various embodiments, the heat conductor is fixed on the end surface via bonding, clipping or welding. This can realize a fixed mechanical connection and thermal connection between the heat conductor and the first electronic module.

In various embodiments, the heat conductor is a heat conduction stick or a heat conduction flake. The heat conductor stick can be bonded or welded on the end surface of the first electronic module; and the heat conduction flake can be engaged with, via a clip, and bonded or welded on the end surface of the first electronic module. Of course, the object of thermal conduction also can be achieved with other heat conductors having a suitable structure or similar shape.

In various embodiments, the first electronic module is an IC chip or an inductor, or other electronic elements, wherein the IC chip has a smaller height than electronic devices likes the inductor.

Preferably, the potting material is a solidifiable liquid or gel.

In addition, various embodiments further relate to a method for manufacturing the driver assembly, including:
(a) providing a driver having at least one first portion and a second portion;
(b) providing a driver housing, wherein the driver housing is formed with a first cavity for accommodating at least one first portion of the driver and a second cavity for accommodating the second portion of the driver, wherein the first portion has a lower heat resistance than the second portion;
(c) filling a potting material in the first cavity; and
(d) mounting the driver in the driver housing, wherein the first portion is at least partially inserted into the first cavity corresponding thereto to encapsulate the first portion.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which.

DETAILED DESCRIPTION

The following detailed description refers to the accompanying drawing that show, by way of illustration, specific details and embodiments in which the disclosure may be practiced.

Figure 1:
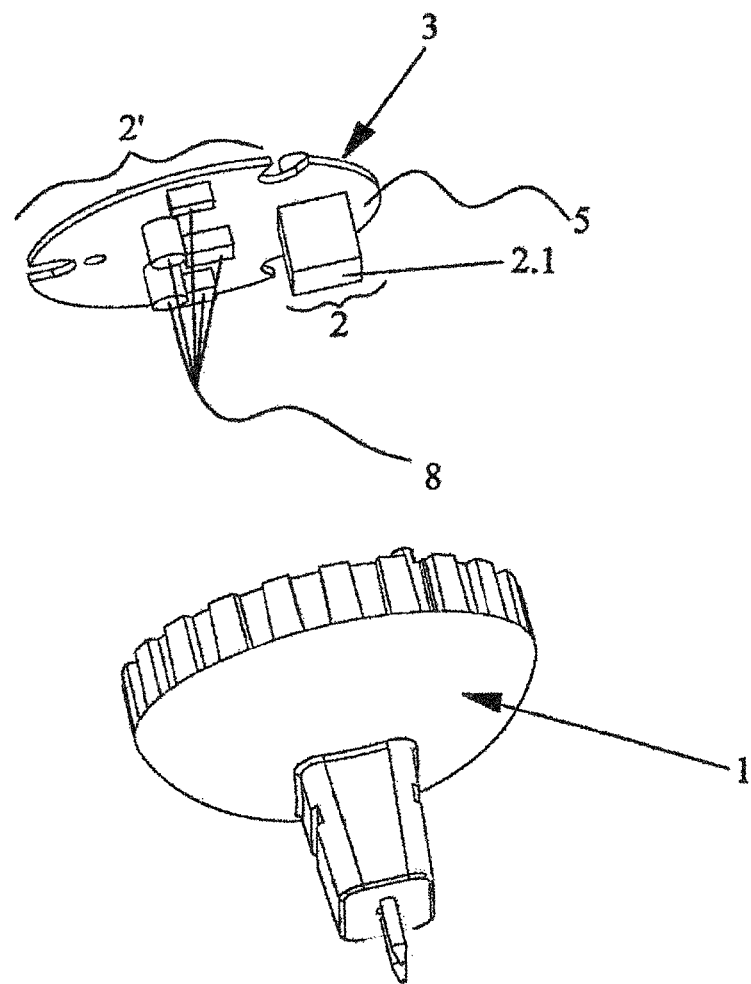
FIG. 1 is an exploded three dimensions-view of a driver assembly of the present invention.

FIG. 1 is an exploded three dimensions-view of a driver assembly of the present disclosure. The driver assembly comprises a driver 3 and a driver housing 1 accommodating the driver 3. The driver 3 comprises a PCB board 5 and a plurality of second electronic modules 8 mounted at both sides thereof, wherein a first electronic module 2.1 that has a lower heat resistance than the second electronic modules 8 acts as a first portion 2 located on a side surface of the PCB board 5 facing the driver housing 1, and the PCB board 5 and at least one second electronic module 8 act as a second portion 2' of the driver 3 having a high heat resistance. In order to assure the driver 3 to be fixedly accommodated in the driver housing 1, an inner cavity of the driver housing 1 at least partially matches the driver 3 in shape.

Figure 2:
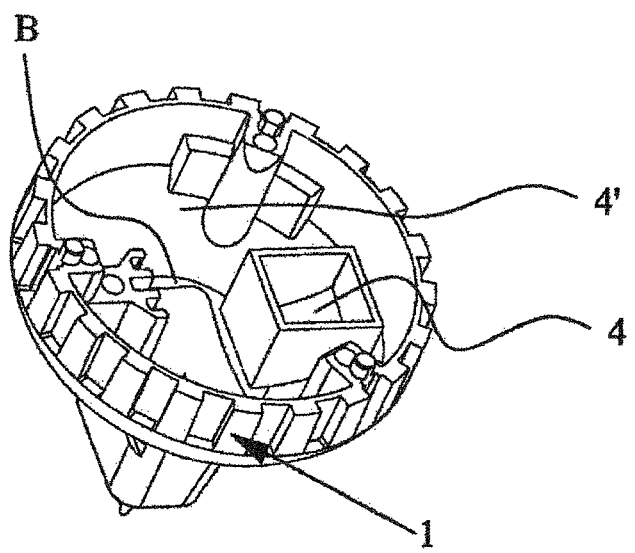
FIG. 2 is a top three dimensions-view of a driver housing in FIG. 1.

FIG. 2 is a top three dimensions-view of a driver housing 1 of the driving assembly of the present disclosure. It can be seen clearly from FIG. 2 that a first cavity 4 is formed in the driver housing 1, and it is defined by inner closed ribs extending towards the driver 3 on a bottom B of the driver housing 1 by a process such as injection molding or similar technology. Apart from the first cavity 4, remaining space in the driver housing 1 is defined to be a second cavity 4' for accommodating the second portion 2'. The first cavity 4 should have a shape matched with that of the first electronic module 2.1 to be enveloped, and is slightly bigger than the first electronic module 2.

Figure 3:
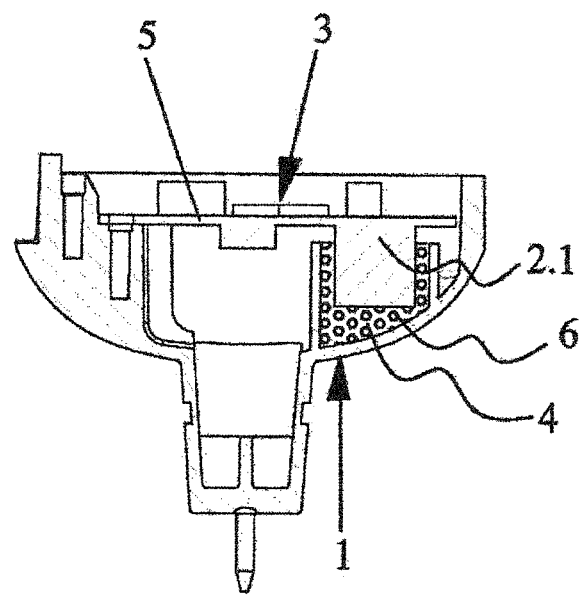
FIG. 3 is a lateral sectional view of a first variant of the driver assembly of the present disclosure.

FIG. 3 is a lateral sectional view of an embodiment of the driver assembly of the present disclosure. The first electronic module 2.1 such as inductor as the first portion 2 of the driver 3 has a big height, in which case, the first electronic module 2.1 per se can be totally inserted into the first cavity 4 formed in the driver housing 1. At this time, a liquid or gelatinous potting material 6 in the first cavity 4 is extruded by the first electronic module 2.1 inserted into the first cavity 4 to fill the whole first cavity 4. The first electronic module 2.1 is enveloped after the potting material 6 is cooled, which is reflected ideally in FIG. 3 that the first electronic module 2.1 is totally enveloped in the first cavity 4. Therefore, heat from the first electronic module 2.1 can be transferred via the potting material 6 to the driver housing 1 for thermal dissipation.

Figure 4:
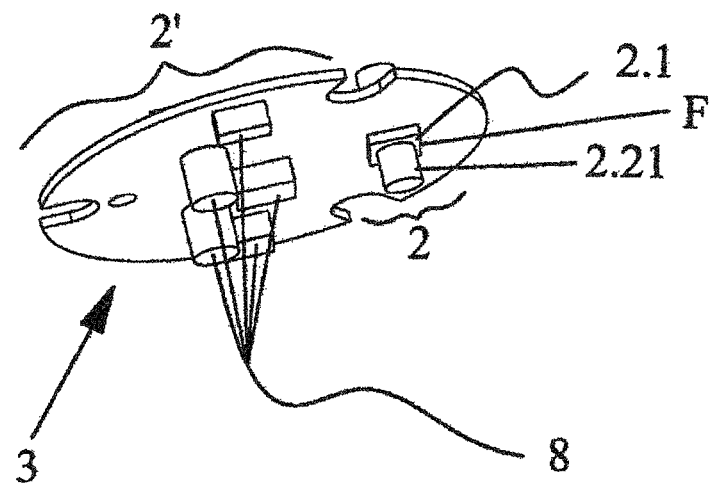
FIG. 4 is an example of a second variant of the driver assembly of the present disclosure.
Figure 5:
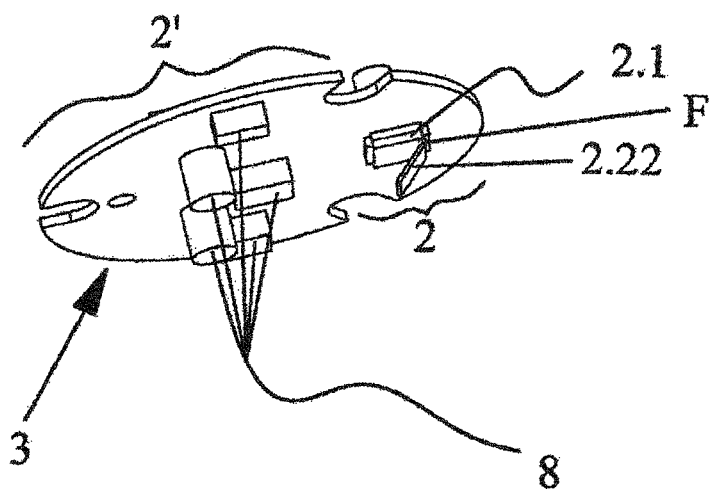
FIG. 5 is another example of the second variant of the driver assembly of the present disclosure.

FIG. 4 and FIG. 5 show two examples of another variant of the driver assembly of the present disclosure. Different from the embodiment shown in FIG. 3, the first electronic module 2.1, such as IC chip, comprised by the first portion 2 of the driver 3 has a small height, in which case, the first portion 2 therefore can additionally comprise a heat conductor 2.2. The heat conductor 2.2 is inserted into the first cavity 4, and only the heat conductor 2.2 per se or the heat conductor 2.2 and the first electronic module 2.1 are jointly enveloped. The heat conductor 2.2, for example, also can be a heat conduction stick 2.21 shown in FIG. 4 or a heat conduction flake 2.22 shown in FIG. 5. Of course, the heat conductor 2.2 also can be configured to be a heat conduction member in other forms mounted on an end surface F of the first electronic module 2.1. The heat conduction stick 2.21 can be directly, for example, welded or bonded on the end surface F of the first electronic module 2.1. The heat conduction flake 2.22 has a clip portion configured to be mounted on the end surface F of the first electronic module 2.1, and the heat conduction flake 2.22 can be engaged with the end surface F of the first electronic module 2.1 via the clip and is further fixed via welding or bonding. It should be noted that such connection manners also can realize a thermal connection. During the enveloping process, the heat conductor 2.2 is completely inserted into the first cavity 4 and is enveloped by the potting material 6. In an ideal situation, at least part of the first electronic module 2.1 is also enveloped by the potting material 6. As a result, heat from the first electronic module 2.1 is guided by the heat conductor 2.2 to the driver housing 1.

Figure 6:
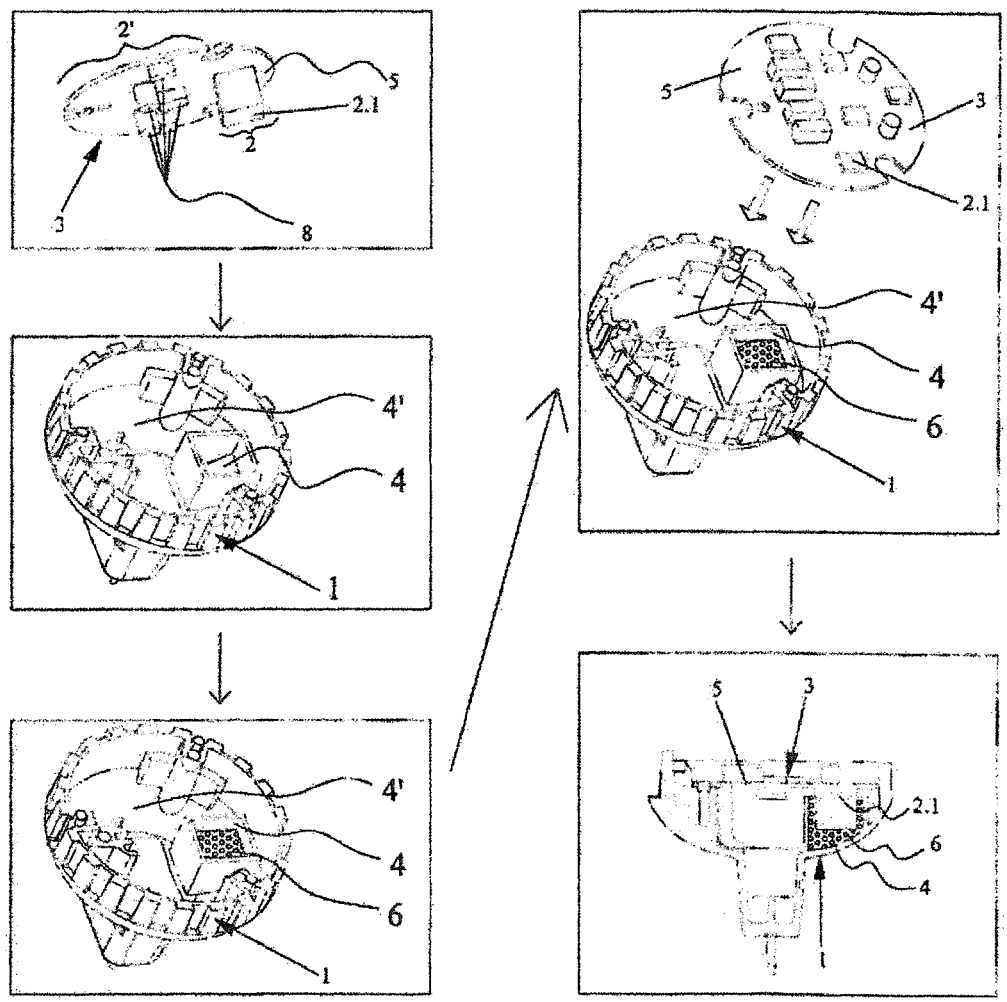
FIG. 6 is a flow chart of a method for manufacturing the driver assembly of the present disclosure.

FIG. 6 is a flow chart of a method for manufacturing a driver assembly of the present disclosure. A manufacturing process is as follows: step 1, providing a driver 3 having a first portion 2 and a second portion 2'; step 2, providing a driver housing 1, wherein inner closed ribs extending towards the driver 3 on a bottom B of the driver housing 1 define a first cavity 4 for accommodating the first portion 2 of the driver 3, and remaining space of the driver housing 1 is defined as a second cavity 4' for accommodating the second portion 2' of the driver 3, wherein the first portion 2 has a lower heat resistance than the second portion 2'; and, step 3, potting a small amount of potting material 6 into the first cavity 4, thereafter, arranging the driver 3 in the driver housing 1 such that the first portion 2 just can be completely or partially inserted into the first cavity 4 to form an enveloped structure.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

LIST OF REFERENCE SIGNS 1 driver housing
2 first portion having a low heat resistance
2' second portion having a high heat resistance
2.1 first electronic module
2.2 heat conductor
2.21 heat conduction stick
2.22 heat conduction flake
3 driver
4 first cavity
4' second cavity
5 PCB board
6 potting material
8 second electronic module
B bottom
F end surface of first electronic module

The invention claimed is:

1. A driver assembly, comprising:
a driver housing and
a driver, the driver comprising at least one first portion and a second portion, the first portion having a lower heat resistance than the second portion,
wherein the driver housing comprises at least one first cavity for at least partially accommodating the first portion and a second cavity for accommodating the second portion, and a potting material is potted into the first cavity to envelop the first portion.

2. The driver assembly according to claim 1, wherein the first portion is a first electronic module, and the second portion comprises a PCB board for mounting the first electronic module and at least one second electronic module mounted on the PCB board.

3. The driver assembly according to claim 2, wherein the driver housing comprises a bottom for supporting the PCB board, the first cavity is defined by inner frame formed in one piece with the bottom, and the second cavity is the space in the driver housing other than the first cavity.

4. The driver assembly according to claim 3, wherein the first cavity has a geometrical shape matched with the first electronic module.

5. The driver assembly according to claim 2, wherein the first cavity merely accommodates the first electronic module.

6. The driver assembly according to claim 1, wherein the first portion further comprises a heat conductor connected to an end surface of the first electronic module facing the first cavity, and the heat conductor and the first electronic module as a whole are at least partially accommodated in the first cavity.

7. The driver assembly according to claim 6, wherein the heat conductor is fixed on the end surface via bonding, clipping or welding.

8. The driver assembly according to claim 7, wherein the heat conductor is a heat conduction stick or a heat conduction flake.

9. The driver assembly according to claim 1, wherein the first electronic module is an IC chip or an inductor.

10. The driver assembly according to claim 1, wherein the potting material is a solidifiable liquid or gel.

11. A method for manufacturing a driver assembly, the method comprising:
providing a driver having at least one first portion and a second portion;
providing a driver housing, wherein the driver housing is formed with a first cavity for accommodating the at least one first portion of the driver and a second cavity for accommodating the second portion of the driver, wherein the first portion has a lower heat resistance than the second portion;
filling a potting material in the first cavity; and
mounting the driver in the driver housing, wherein the first portion is at least partially inserted into the first cavity corresponding thereto to encapsulate the first portion.

\* \* \* \* \*